United States Patent
Yeap et al.

(10) Patent No.: US 7,103,959 B2
(45) Date of Patent: Sep. 12, 2006

(54) CONDUIT FOR PREVENTING OXIDATION OF A ELECTRONIC DEVICE

(75) Inventors: Boon June Yeap, Singapore (SG); Jie Wei Hu, Singapore (SG); Rong Duan, Singapore (SG); Ka Shing Kenny Kwan, Singapore (SG)

(73) Assignee: ASM Technology Singapore PTE Ltd., Singapore (SG)

( * ) Notice: Subject to any disclaimer, the term of this patent is extended or adjusted under 35 U.S.C. 154(b) by 533 days.

(21) Appl. No.: 10/324,643

(22) Filed: Dec. 17, 2002

(65) Prior Publication Data

US 2004/0115959 A1     Jun. 17, 2004

(51) Int. Cl.
*B23P 23/00*     (2006.01)
(52) U.S. Cl. .................. 29/564; 29/33 P; 29/564.1; 29/729; 228/4.5; 228/6.2
(58) Field of Classification Search .............. 29/33 P, 29/564.1, 729, 564; 228/4.5, 6.2
See application file for complete search history.

(56) References Cited

U.S. PATENT DOCUMENTS

| | | | | |
|---|---|---|---|---|
| 5,609,290 A | * | 3/1997 | Bobbio et al. | 228/206 |
| 5,899,737 A | * | 5/1999 | Trabucco | 438/615 |
| 6,283,358 B1 | * | 9/2001 | Ball | 228/180.21 |
| 6,392,286 B1 | * | 5/2002 | Jin et al. | 257/660 |
| 6,808,592 B1 | * | 10/2004 | Rigali et al. | 156/345.31 |

* cited by examiner

*Primary Examiner*—Carl J. Arbes
(74) *Attorney, Agent, or Firm*—Ostrolenk, Faber, Gerb & Soffen, LLP

(57) ABSTRACT

An apparatus to prevent oxidation of an electronic device, such as a semiconductor substrate during a semiconductor packaging process, comprises a substantially-enclosed conduit having at least one movable support defining a path through which the electronic device may travel and a plurality of gas outlets to introduce a relatively inert gas into the conduit. Conveying means adapted to engage and move the electronic device along the conduit is provided, and an opening along a portion of the conduit allows engagement between the conveying means and the electronic device. Actuating means are adapted to shift the movable support whereby the size of the path is adjustable to suit different electronic devices.

8 Claims, 4 Drawing Sheets

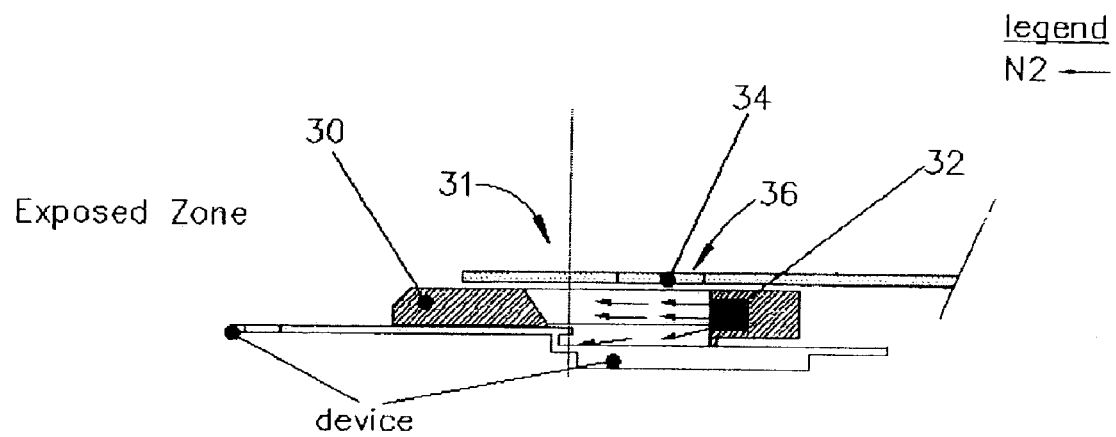
Figure 5 – Bonding area
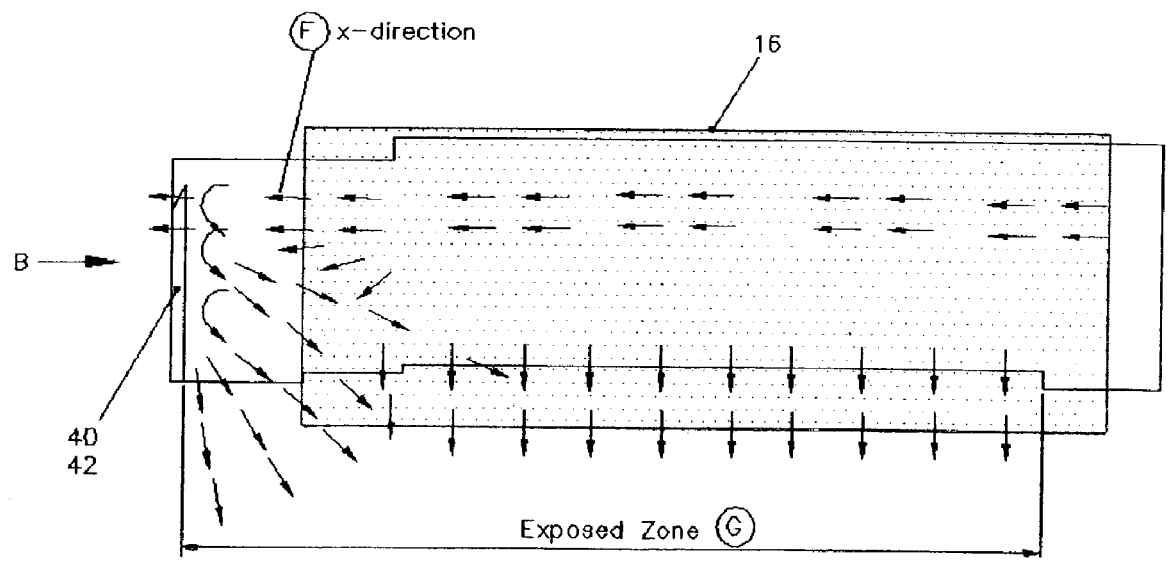
Figure 6

CONDUIT FOR PREVENTING OXIDATION OF A ELECTRONIC DEVICE

FIELD OF THE INVENTION

The invention relates to an apparatus and method for preventing oxidation of an electronic device, such as a semiconductor substrate, during a semiconductor packaging process. In particular, the apparatus includes a conduit for conveyance of a substrate, such as copper alloy substrate, whereby an inert gas is introduced into the conduit to inhibit oxidation of the substrate.

BACKGROUND AND PRIOR ART

Semiconductor substrates serve as substrates for the manufacture of certain semiconductor packages onto which semiconductor dice or integrated circuit chips are attached during packaging. Conventionally, substrates are made from iron alloys. However, with an increasing demand for higher performance miniaturized packages, more reactive metals, in particular copper alloy substrates are finding increasing applications in semiconductor packages. These substrates are found to be more attractive than iron alloy substrates due to factors such as better heat dissipation, ease of processing and their lower cost. On the other hand, the disadvantage of copper alloy is that it is prone to oxidation (ie. it reacts with oxygen to produce copper oxide) when exposed to oxygen in the air at high temperatures. Such oxidation results in oxygen forming weak bonds with the atoms at the substrate surface, and a layer of brittle and/or poorly adhering oxides. Thus, oxidation introduces reliability problems for semiconductor packages.

The problem of oxidation is particularly acute during wire-bonding in a typical semiconductor packaging process, wherein conductive bonding wires are bonded to contact surfaces on a semiconductor die and a substrate to establish electrical connections therebetween. In a wire-bonding machine, a substrate may typically be introduced onto a heating plate first for pre-bond heating. Thereafter, the substrate is conveyed to a bonding area to perform wire bonding. After wire-bonding, the substrate needs to be conveyed out of the wire-bonding machine. The substrate should typically be pre-heated to a certain temperature before actual wire-bonding is carried out. Such pre-bond heating may be accomplished by placing the substrate on a heating plate during conveyance to the bond-site. Actual wire-bonding is then commonly done by using an ultrasonic transducer to generate mechanical vibration energy with an external pressure force to bind the wire to the die and substrate surfaces. Heat generated during the conveyance or actual wire-bonding processes may oxidize the surface of the substrate if the substrate is not protected from oxygen in the atmosphere, leading to non-stick or unreliability of the bonds made.

An industry practice for protecting substrates from oxidation is to introduce large amounts of a relatively inert gas, usually nitrogen gas, to the substrate. The nitrogen gas will reduce the amount of oxygen in the immediate vicinity of the substrate, and thus prevent oxidation of the substrate. Therefore, it is preferable for the substrate to be channeled through a nitrogen-rich conduit during the above processes.

One way this can be done is to build a so-called heat-tunnel wherein the substrate is conveyed through an enclosed space filled with nitrogen gas, such that exposure of the substrate to the atmosphere is minimized. However, as will be explained in more detail with reference to FIGS. 1 & 2, the conventional heat-tunnel system has its disadvantages. As shown in FIG. 2, the heat-tunnel comprises a work holder system, tunnel cover and a pin indexer, each of which is designed for a particular shape or size of substrate. If a different substrate were to be used, all the parts comprising the heat-tunnel have to be changed. As a result, longer down-time in the production line is incurred, and the changes demand repeated design effort and costs. Skill is needed to reset the system mechanically. Moreover, the use of the indexing pin to move the substrate through the heat-tunnel is inflexible, in that different sizes of pins have to be used for different sizes of corresponding indexing holes on the substrates and a slot in the tunnel cover allowing for pin movement has to be appropriate to cater to the pitching distance of the substrate in question.

SUMMARY OF THE INVENTION

Therefore, it is an object of the present invention to overcome some of the above shortcomings of the prior art and to provide an improved conduit for preventing oxidation of a substrate during a semiconductor manufacturing process, especially in relation to a wire-bonding process.

According to a first aspect of the invention, there is provided an apparatus for preventing oxidation of an electronic device, comprising a substantially-enclosed conduit having at least one movable support defining a path through which the electronic device may travel; a plurality of gas outlets capable of introducing a relatively inert gas into the conduit; conveying means adapted to engage and move the electronic device along the conduit; and an opening along a portion of the conduit to allow engagement between the conveying means and the electronic device; wherein the apparatus includes actuating means adapted to shift the movable support whereby the size of the path is adjustable to suit different electronic devices.

According to a second aspect of the invention, there is provided a method for preventing oxidation of an electronic device, comprising the steps of: providing a substantially-enclosed conduit having at least one movable support defining a path through which the electronic device may travel; introducing a relatively inert gas into the conduit through a plurality of gas outlets; moving the electronic device along the conduit by engagement between a conveying means and the electronic device through an opening along a portion of the conduit; wherein different sizes of electronic devices may be accommodated by actuating the movable support to adjust the size of the path.

It will be convenient to hereinafter describe the invention in greater detail by reference to the accompanying drawings, which illustrate one embodiment of the invention. The particularity of the drawings and the related description is not to be understood as superseding the generality of the broad identification of the invention as defined by the claims.

BRIEF DESCRIPTION OF THE DRAWINGS

FIG. 5 is a cross-sectional view of a bonding area along section $A^2$—$A^2$ of FIG. 3 according to the preferred embodiment of the invention;

FIG. 6 is an illustration of a flow direction of nitrogen gas within the conduit in the pre-bond site.

DETAILED DESCRIPTION OF THE PREFERRED EMBODIMENT

Figure 1:
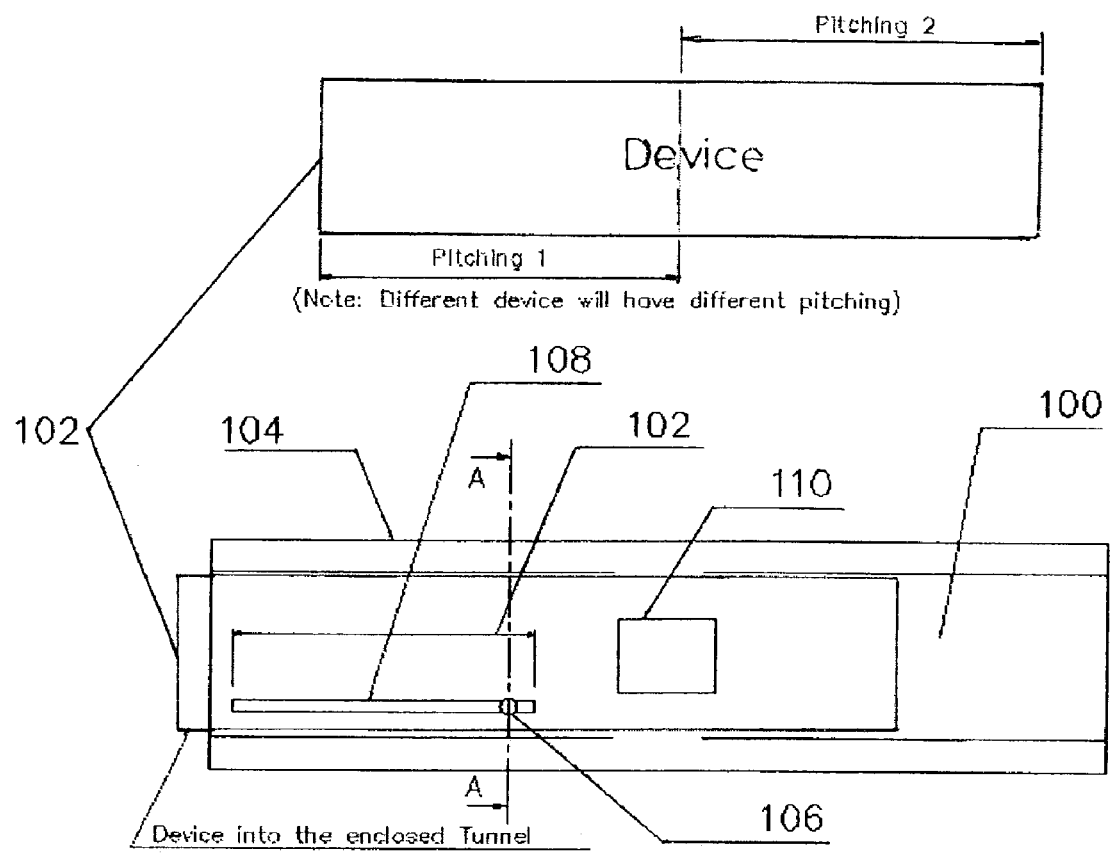
FIG. 1 is a plan view of a heat-tunnel of the prior art.

FIG. 1 is a plan view of a heat-tunnel 100 of the prior art, that is operable in conjunction with a wire-bonding machine. An electronic device or substrate 102 to be wire-bonded is placed inside the heat-tunnel, which is covered by a tunnel cover 104. A die (not shown) has already been attached to the substrate 102 and the substrate 102 is ready for wire-bonding. The heat-tunnel 100 reduces exposure of the substrate 102 to the atmosphere, as the substrate 102 is being heated for the wire-bonding operation. In order to move the substrate 102 along the heat tunnel 100, an indexing pin 106 is extended into a hole formed in the substrate 102 through a slot 108 formed in the tunnel cover 104. As the indexing pin 106 is moved, it pushes the substrate 102 along the heat tunnel 100.

There is an opening 110 in the tunnel cover 104 at a bond-site location, which corresponds to a position of a bond-tip (not shown) of the wire-bonding machine. That is the location where wire-bonding of the substrate 102 is carried out.

Figure 2:
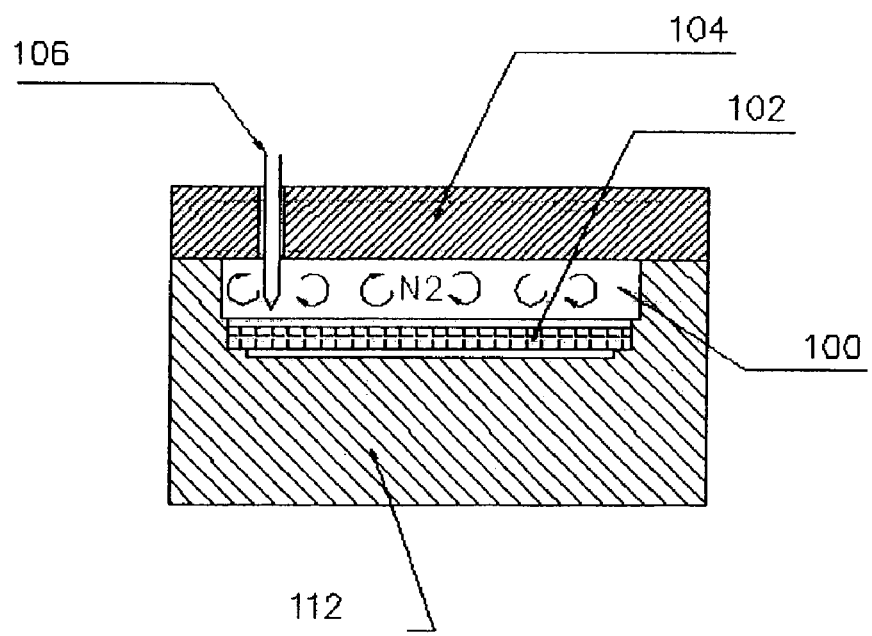
FIG. 2 is a cross-sectional view of the heat-tunnel along section A—A of FIG. 1.

FIG. 2 is a cross-sectional view of the heat-tunnel 100 along section A—A of FIG. 1. The substrate 102 rests on a work holder 112, which is generally U-shaped to form a depression or tunnel for the substrate 102 to move through. The substrate 102 is usually heated by heating means when it is in the tunnel to raise its temperature in preparation for wire-bonding. The tunnel cover 104 covers the said tunnel, and an indexing pin 106 extends through the tunnel cover 104 to move and index the substrate 102 through the tunnel. An inert gas, such as nitrogen gas, is blown into the tunnel 100 to reduce the presence of oxygen and prevent oxidation of the substrate.

Figure 3:
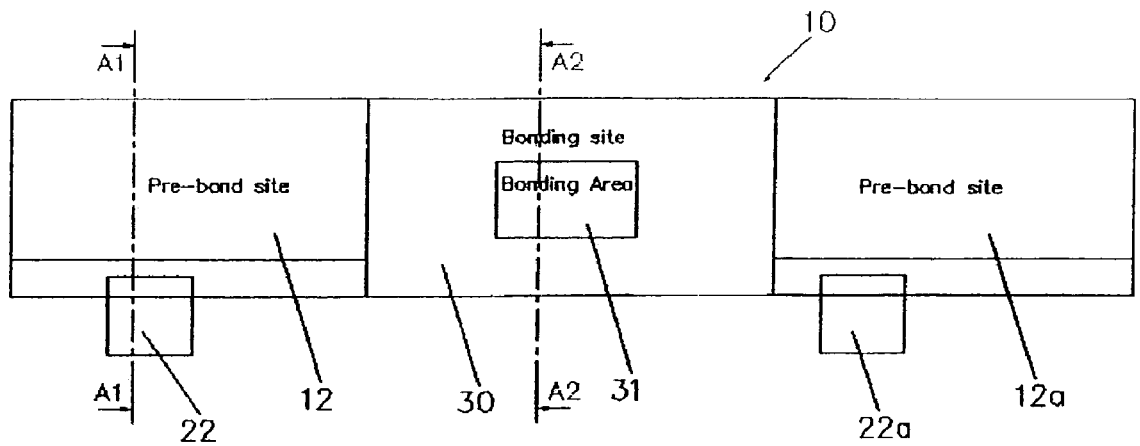
FIG. 3 is a schematic plan layout of various sections of a typical wire-bonding machine that incorporates a conduit for preventing oxidation of a substrate according to a preferred embodiment of the invention.

FIG. 3 is a schematic plan layout of various sections of a typical wire-bonding machine that incorporates a conduit for preventing oxidation of an electronic device such as a semiconductor substrate 16 according to a preferred embodiment of the invention. The system comprises a conduit cover 12, 12a on each side of a window clamp 30 situated near the center of the wire-bonding machine. The two conduit covers 12, 12a are located at pre-bond sites where the substrate(s) 16 is heated (the two pre-bond sites enable substrates to enter from the left or from the right) and prepared for bonding, whereas the window clamp 30 is located at the bond site where the substrate(s) 16 is wire-bonded. The conduits on either side of the wire-bonding area 31 lead to and/or away from the bonding area, where bonding wires are attached to the substrate(s) 16. In order to move the substrate 16 through the various sections of the wire-bonding machine, conveying means which may be in the form of a clamp indexer 22, 22a instead of an indexing pin is used to clamp and move the substrate 16.

Figure 4:
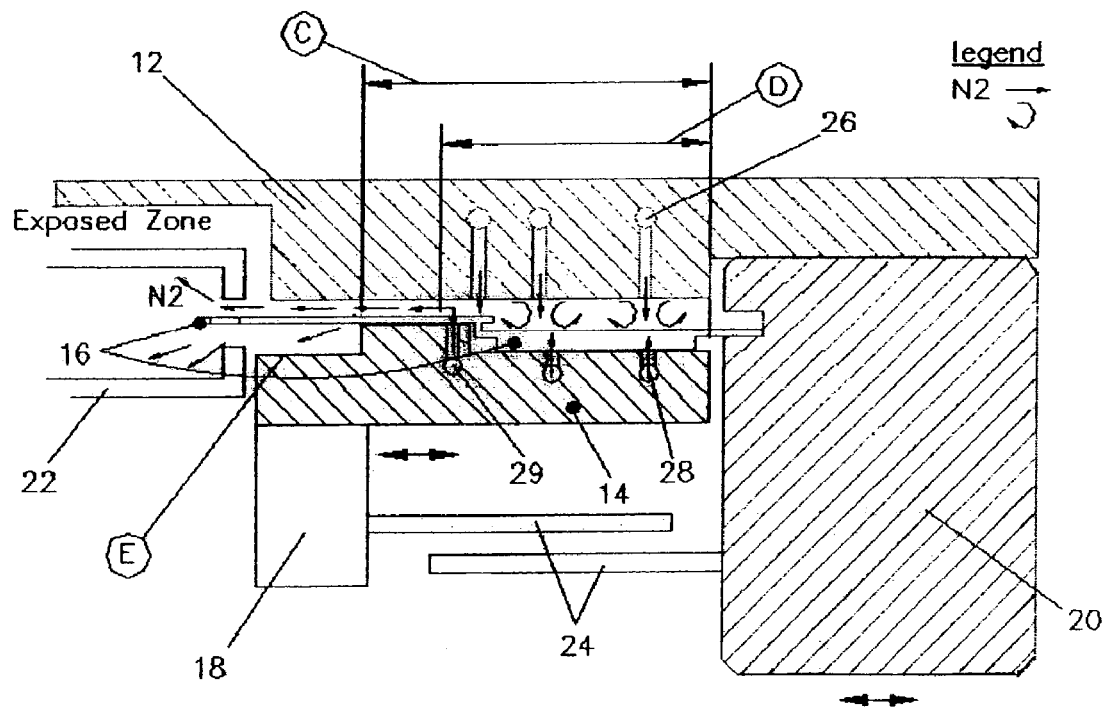
FIG. 4 is a cross-sectional view of a conduit along section $A^1$—$A^1$ of FIG. 3 in a pre-bond site according to a preferred embodiment of the invention.

FIG. 4 is a cross-sectional view of a conduit along section $A^1$—$A^1$ of FIG. 3 in a pre-bond site according to a preferred embodiment of the invention. The substrate 16 rests on a support or platform, which may include a heating plate 14 for pre-bond heating of the substrate 16. Part of the substrate 16 rests within a depression formed on a top surface of the heating plate 14 on the support, and part of it extends outside the heating plate 14 and conduit enclosure through an opening to enable movement and indexing by the clamp indexer 22, such that its exposure to the atmosphere is greater. The substrate 16 shown is a Z-shaped substrate, but other shapes of substrates may also be used with the invention. The heating plate 14 heats up the substrate 16 within the heating zone C to a desired temperature for wire-bonding as the substrate 16 travels along the conduit through the pre-bond site.

The heating plate 14 and support are connected on one side by actuating means in the form of a first actuator 18 that is adjustable to adjust a position of the heating plate 14. On a support at an end of the substrate 16 opposite to the heating plate 14, the actuating means may include a second actuator 20 connected to the support, the support here having a hollowed portion to receive an edge of the substrate 16. The position of the second actuator 20 is also adjustable and it would be appreciated that relative movement between the first actuator 18 and second actuator 20 allows the conduit to receive substrates 16 of different widths. Thus, there is no need to manufacture a new work holder to cater to a different size of substrate 16, as required in the prior art. Overlapping plates 24 below the heating plate 14 also serve to limit the flow of nitrogen gas out of the conduit.

The conduit is enclosed by a conduit cover 12 that is positioned just above the heating plate 14. A combination of the conduit cover 12 and heating plate 14 creates a substantially-enclosed path for the substrate 16 to pass through. There is a an opening or gap formed between the heating plate 14 and the conduit cover 12 in order for part of the substrate 16 to extend outside the conduit. This is to enable an edge of the substrate 16 to be engaged by the clamp indexer 22, so that the clamp indexer 22 is able to move the substrate 16 along the conduit. However, the gap should be made as small as possible to limit the escape of an inert gas, such as nitrogen gas, inside the conduit.

Nitrogen gas may be introduced into the conduit through gas outlets distributed along one or more surfaces inside the conduit, that may be in the form of nozzles 26 formed in the conduit cover 12 and nozzles 28 formed in the heating plate 14. It is preferable that the nitrogen gas be spread over as wide an area as possible, so for example, nozzles 29 may be included in the opening between the conduit cover 12 and heating plate 14 within the bonding zone D to introduce nitrogen gas onto the part of the substrate adjacent the opening. It is most important for the part of the substrate 16 inside the bonding zone D to be kept free from oxidation.

Furthermore, as zone E of FIG. 4 is outside the heating zone C, heating of that portion of the substrate 16 is reduced by forming a depression at zone E, to avoid contact of that portion of the substrate 16 at zone E with the heating plate 14. Thus the exposure of the substrate 16 at zone E to oxidation is reduced.

FIG. 5 is a cross-sectional view of the bonding area along section $A^2$—$A^2$ of FIG. 3 according to the preferred embodiment of the invention. The substrate 16 has been moved along the conduit from the pre-bond site to the bonding area. At the bonding area, the substrate 16 is held in place by a window clamp 30. Nitrogen gas may be introduced to protect the substrate 16 from oxidation via gas outlets 32 created in the body of the window clamp 30. Moreover, nitrogen gas may be introduced via one or more gas outlets formed in the work holder (not shown) from underneath the substrate 16. To further protect the substrate 16 from the general atmosphere during wire-bonding, a moving cover 34 is positioned just above the wire clamp 30 to cover the bonding area 31. To allow a bond tip (not shown) access to the substrate 16, a hole of sufficient size is formed in the moving cover 34 for the bond tip to extend through.

FIG. 6 is an illustration of a flow direction of nitrogen gas within the conduit in the pre-bond site. The general directions of some representative flow-paths of nitrogen gas are illustrated by direction arrows F. It would be appreciated that nitrogen gas is introduced at various locations in the conduit and will tend to travel in various directions. Nitrogen gas would tend to escape from the conduit at the exposed zone G where the clamp indexer 22 is located and at the end of the conduit designated as B. The end opposite to end B is less of a problem because it is adjacent to the bonding area, where nitrogen gas may also be introduced into the conduit. For nitrogen gas flowing in the x-direction designated by F, top and bottom guide walls 40, 42 significantly block the nitrogen gas from escaping at end B. Instead, the top and bottom guide walls 40, 42 deflect the nitrogen gas so that end B receives sufficient nitrogen gas to prevent oxidation of the substrate 16 at that end.

Figure 7:
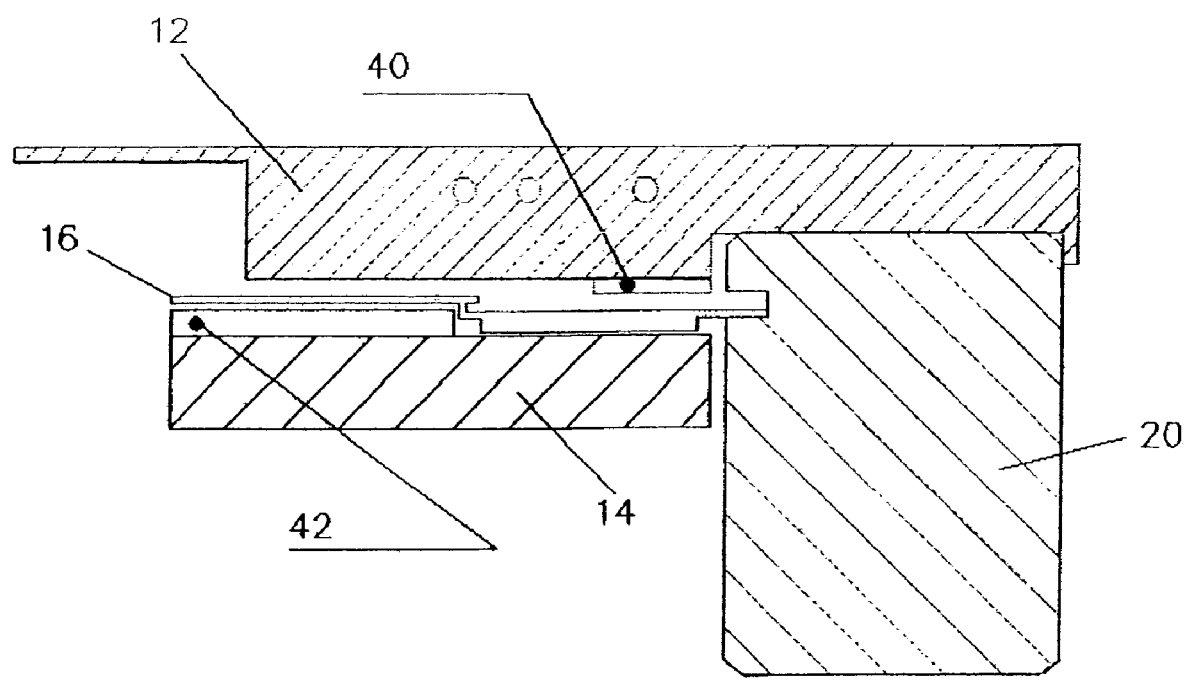
FIG. 7 is a side view of the system looking from its end designated as B in FIG. 6, showing top and bottom guide walls of the system.

FIG. 7 is a side view of the conduit looking from its end designated as B in FIG. 6 showing top and bottom guide walls 40, 42 of the conduit. The top guide wall 40 extends from a bottom surface of the conduit cover 12, whereas the bottom guide wall 42 extends from a top surface of the heating plate 14. The designs of the top and bottom guide walls 40, 42 are such that as much nitrogen gas as possible is blocked from leaving the conduit, while at the same time leaving a space for the substrate 16 to be delivered into the conduit from the side of the conduit.

The invention described herein is susceptible to variations, modifications and/or additions other than those specifically described and it is to be understood that the invention includes all such variations, modifications and/or additions which fall within the spirit and scope of the above description.

The invention claimed is:

1. Apparatus for preventing oxidation of an electronic device, comprising:
   a substantially-enclosed conduit having at least one movable support defining an adjustable path through which the electronic device may travel;
   a plurality of gas outlets configured to introduce relatively inert gas into the conduit;
   a conveyor located outside the conduit to engage and move the electronic device along the conduit;
   an opening along a portion of the conduit through which a part of the electronic device is extendable for engagement by the conveyor located outside the conduit; and
   actuating means operative to shift the movable support for adjusting a width of the path to receive electronic devices of different widths.

2. Apparatus according to claim 1, wherein the movable support includes a heating plate contactable with and thereby to heat up the part of the electronic device inside a heating zone of the electronic device within the conduit.

3. Apparatus according to claim 1, wherein the conveyor is an indexing clamp.

4. Apparatus according to claim 1, wherein the gas outlets are distributed along one or more surfaces inside the substantially-enclosed conduit to introduce the inert gas into the conduit.

5. Apparatus according to claim 4, including gas outlets located at the opening along the conduit to introduce the inert gas onto a part of the electronic device adjacent the opening.

6. Apparatus according to claim 1, including a guide wall at an end of the conduit to substantially block the inert gas from escaping at said end of the conduit.

7. Apparatus according to claim 1, wherein the conduit leads to and/or away from a bonding area for attaching bonding wires to the electronic device.

8. Apparatus according to claim 7, including a window clamp at the bonding area adapted to hold the electronic device during wire bonding, and which includes a gas outlet to introduce an inert gas to an area of the electronic device exposed by the window clamp during wire-bonding.

* * * * *